(12) United States Patent
Hu et al.

(10) Patent No.: US 12,666,704 B2
(45) Date of Patent: Jun. 23, 2026

(54) SEMICONDUCTOR DEVICE AND FABRICATING METHOD OF THE SAME

(71) Applicant: UNITED MICROELECTRONICS CORP., Hsin-Chu (TW)

(72) Inventors: Ya-Ting Hu, Kaohsiung City (TW); Chih-Yi Wang, Tainan City (TW); Yao-Jhan Wang, Tainan City (TW); Wei-Che Chen, Kaohsiung City (TW); Kun-Szu Tseng, Tainan City (TW); Yun-Yang He, Changhua County (TW); Wen-Liang Huang, Hsinchu City (TW); Lung-En Kuo, Tainan City (TW); Po-Tsang Chen, Tainan City (TW); Po-Chang Lin, Tainan City (TW); Ying-Hsien Chen, Tainan City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 443 days.

(21) Appl. No.: 18/206,609

(22) Filed: Jun. 6, 2023

(65) Prior Publication Data

US 2024/0379670 A1 Nov. 14, 2024

(30) Foreign Application Priority Data

May 8, 2023 (TW) ................................. 112116962

(51) Int. Cl.
*H10D 84/83* (2025.01)
*H10D 84/85* (2025.01)
(Continued)

(52) U.S. Cl.
CPC ......... *H10D 84/834* (2025.01); *H10D 84/856* (2025.01); *H10W 10/0143* (2026.01);
(Continued)

(58) Field of Classification Search
CPC ......... H01L 21/76224; H01L 21/76229; H01L 21/76232; H01L 21/76283; H10D 84/0151; H10D 84/856; H10W 10/014; H10W 10/17; H10W 10/0143; H10W 10/0145; H10W 10/061; H10W 10/181; H10P 90/1906
See application file for complete search history.

(56) References Cited

U.S. PATENT DOCUMENTS 9,330,956 B1 5/2016 Lo
2005/0139865 A1* 6/2005 Choi ................. H10W 10/0145
257/E21.549

(Continued)

*Primary Examiner* — Britt Hanley
*Assistant Examiner* — Jason James Greaving
(74) *Attorney, Agent, or Firm* — Winston Hsu

(57) ABSTRACT

A semiconductor device includes a substrate with a high voltage region and a low voltage region. A first deep trench isolation is disposed within the high voltage region. The first deep trench isolation includes a first deep trench and a first insulating layer filling the first deep trench. The first deep trench includes a first sidewall and a second sidewall facing the first sidewall. The first sidewall is formed by a first plane and a second plane. The edge of the first plane connects to the edge of the second plane. The slope of the first plane is different from the slope of the second plane.

8 Claims, 5 Drawing Sheets

(51) Int. Cl.
*H10W 10/00* (2026.01)
*H10W 10/17* (2026.01)
*H10D 84/00* (2025.01)

(52) U.S. Cl.
CPC ....... *H10W 10/0145* (2026.01); *H10W 10/17* (2026.01); *H10D 84/151* (2025.01)

(56) References Cited

U.S. PATENT DOCUMENTS

| | | | |
|---|---|---|---|
| 2008/0308868 A1 | 12/2008 | Wu | |
| 2017/0062512 A1* | 3/2017 | Chou | H10F 39/026 |
| 2019/0341295 A1* | 11/2019 | Sung | H10D 84/0158 |
| 2023/0062058 A1* | 3/2023 | Zhang | H10D 84/0151 |
| 2023/0246030 A1* | 8/2023 | Huang | H10D 64/513 |
| | | | 257/500 |
| 2023/0268346 A1* | 8/2023 | Chiu | H10D 84/0144 |
| | | | 257/369 |
| 2024/0387523 A1* | 11/2024 | Chen | H10D 84/0158 |

* cited by examiner

SEMICONDUCTOR DEVICE AND FABRICATING METHOD OF THE SAME

BACKGROUND OF THE INVENTION

1. Field of the Invention

The present invention relates to a fabricating method of a deep trench isolation, and more particularly to a method of fabricating deep trenches within a high voltage region and a middle voltage region, and structures of those deep trenches.

2. Description of the Prior Art

In current semiconductor processing, controllers, memories, circuits of low-voltage operation and power devices of high-voltage operation are largely integrated into a single chip to achieve a single-chip system. The power device, such as vertical double-diffusion metal-oxide-semiconductor (VDMOS), insulated gate bipolar transistor (IGBT) and lateral diffusion MOS (LDMOS), is employed to increase power switching efficiency and decrease the loss of energy resources. It is often required that the switching transistors withstand high breakdown voltages and operate at a low on-resistance.

Moreover with the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the fin FET can be controlled by adjusting the work function of the gate.

However as the scale of current devices continue to decrease the integration of high-voltage devices and FinFET devices start to face numerous challenges such as current leakage and control of breakdown voltage. Hence, how to improve the current fabrication for improving performance of the device has become an important task in this field.

SUMMARY OF THE INVENTION

According to a preferred embodiment of the present invention, a semiconductor device includes a substrate including a high voltage region and a low voltage region. A first deep trench isolation is disposed within the high voltage region. The first deep trench isolation includes a first deep trench, wherein the first deep trench includes a first sidewall and a second sidewall, the first sidewall faces the second sidewall, the first sidewall is formed only by a first plane and a second plane, an edge of the first plane connects to an edge of the second plane, a slope of the first plane is different from a slope of the second plane. A first insulating layer fills in the first deep trench isolation. A shallow trench isolation is disposed within the low voltage region. The shallow trench isolation includes a trench disposed on the substrate. A second insulating layer fills in the trench, wherein a depth of the shallow trench isolation is smaller than a depth of the first deep trench.

According to another preferred embodiment of the present invention, a fabricating method of a semiconductor device includes provideing a substrate divided into a high voltage region and a low voltage region. Numerous fin structures are disposed within the low voltage region, and the fin structures protrude from a first surface of the substrate. Next, a first etching process is performed. The first etching process includes removing entirely at least one of the fin structures and etching the substrate within the high voltage region to form a first trench within the high voltage region. After the first etching process, performing the second etching process, wherein the second etching process includes etching the substrate at a bottom of the first trench to extend a second trench from the bottom of the first trench, wherein the first trench and the second trench form a deep trench, the deep trench includes a first sidewall and a second sidewall, the first sidewall faces the second sidewall, the first sidewall is formed only by a first plane and a second plane, an edge of the first plane connects to an edge of the second plane, a slope of the first plane is different from a slope of the second plane. After the second etching process, a third etching process is performed, wherein the third etching process includes segmenting at least one of the fin structures. Finally, an insulating layer is formed in the deep trench.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 8 depict a fabricating method of a semiconductor device according to a preferred embodiment of the present invention, wherein:

FIG. 1 depicts a substrate divided into high voltage region, a middle voltage region and a low voltage region;

FIG. 2 depicts a fabricating stage following FIG. 1;

FIG. 3 depicts a fabricating stage following FIG. 2;

FIG. 4 depicts a fabricating stage following FIG. 3;

FIG. 5 depicts a fabricating stage following FIG. 4;

FIG. 6 depicts a fabricating stage following FIG. 5;

FIG. 7 depicts a fabricating stage following FIG. 6; and

FIG. 8 depicts a fabricating stage following FIG. 7.

DETAILED DESCRIPTION

Figure 7:
Figure 7:
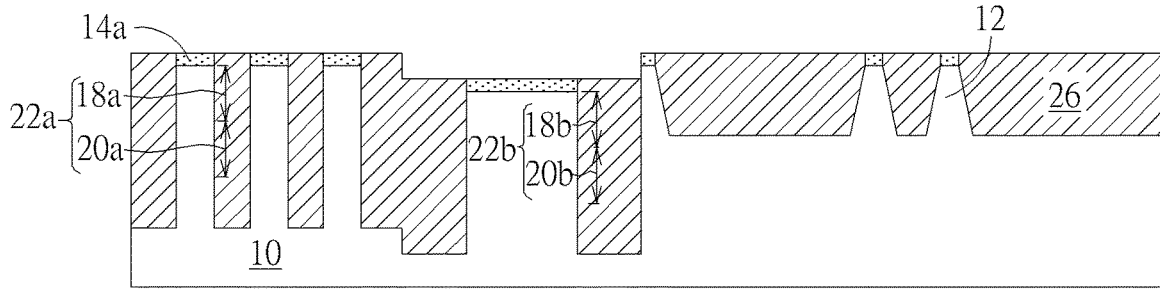
Figure 8:
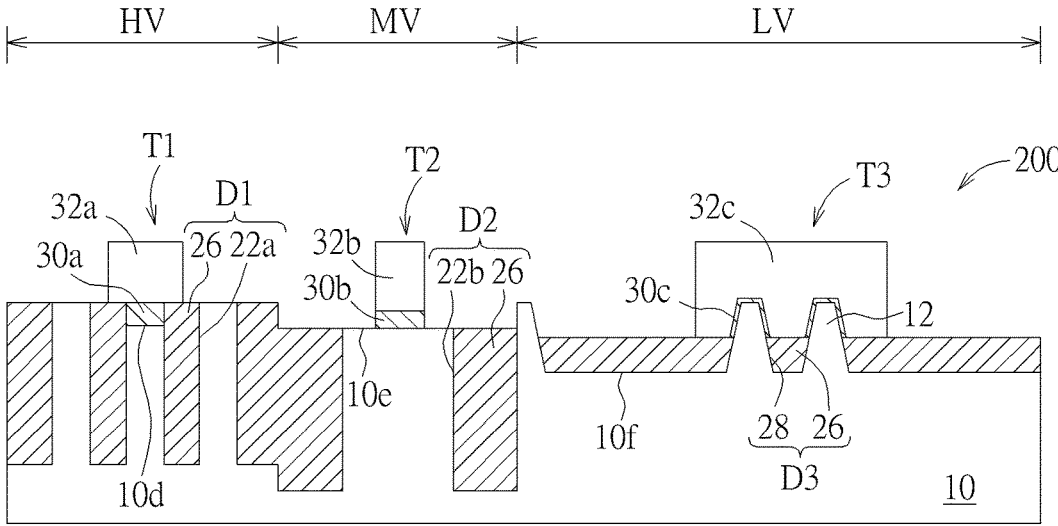
Figure 9A:
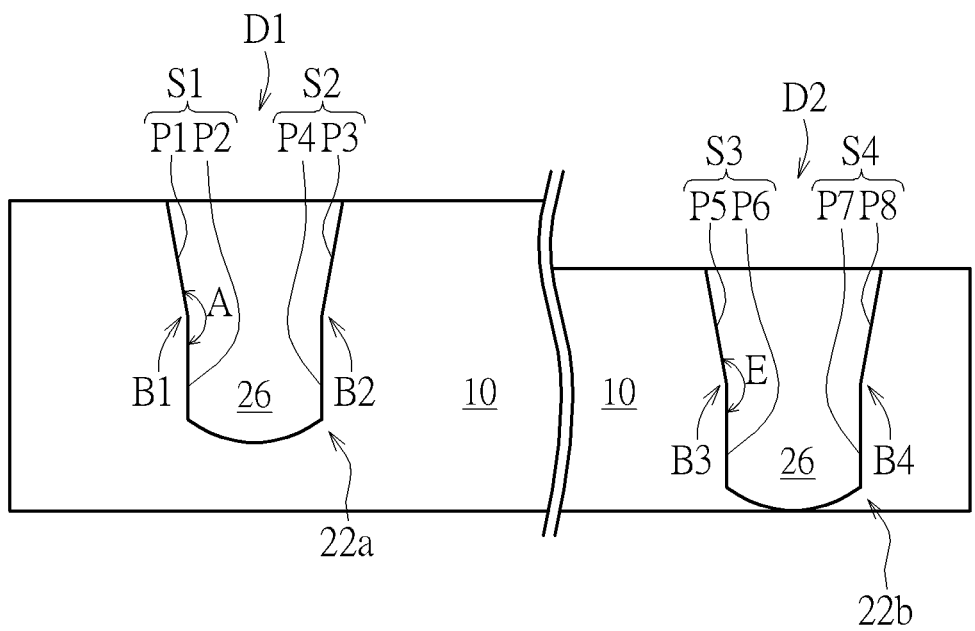
FIG. 9A depicts a magnified view of a deep trench isolation according to a preferred embodiment of the present invention.
Figure 9B:
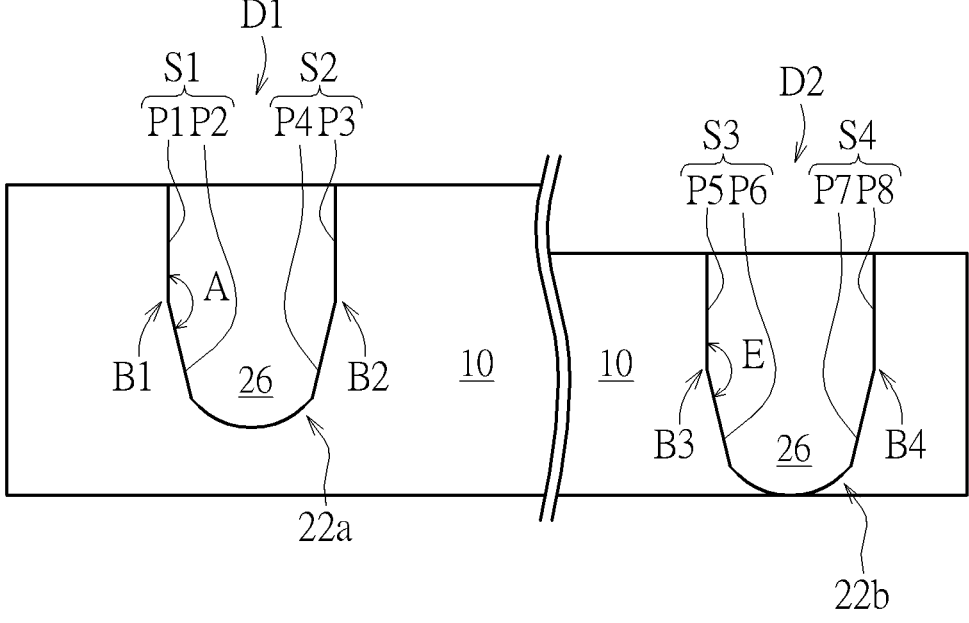
FIG. 9B depicts a magnified view of a deep trench isolation according to another preferred embodiment of the present invention.

FIG. 1 to FIG. 8 depict a fabricating method of a semiconductor device according to a preferred embodiment of the present invention. FIG. 9A depicts a magnified view of a deep trench isolation according to a preferred embodiment of the present invention. FIG. 9B depicts a magnified view of a deep trench isolation according to another preferred embodiment of the present invention.

Figure 1:
Figure 1:
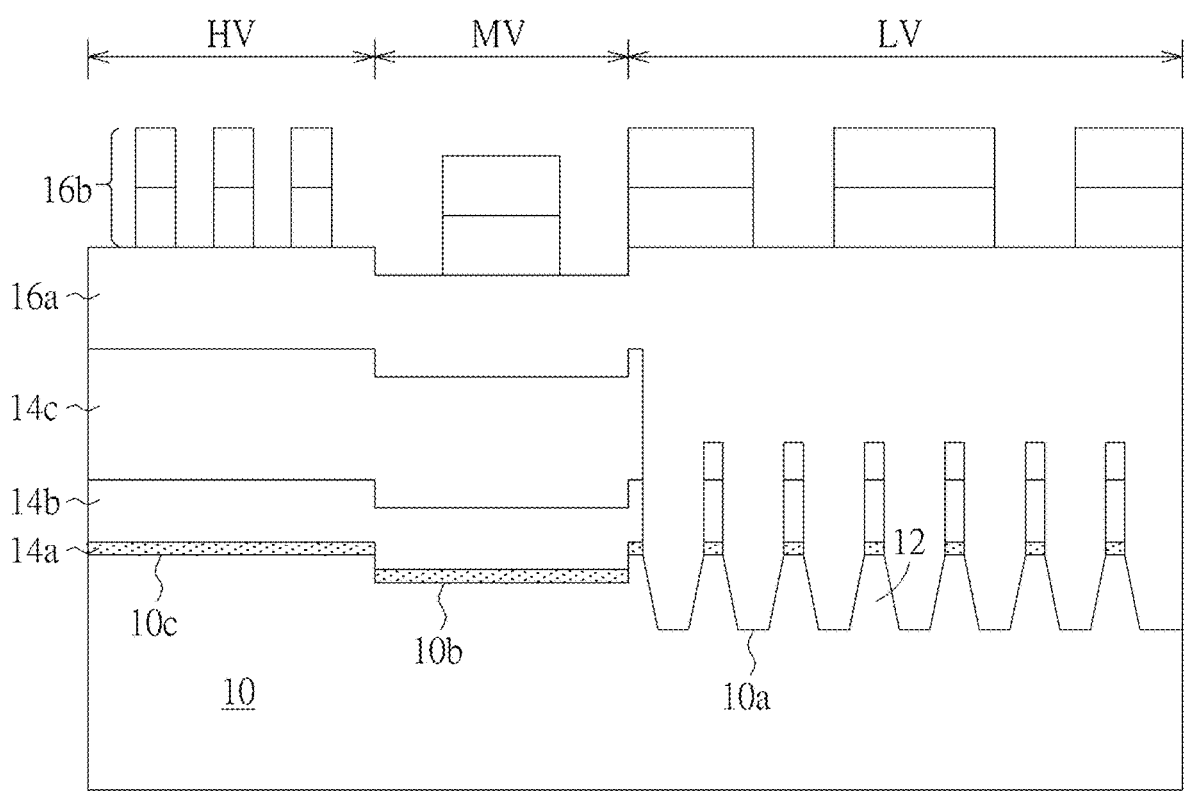

As shown in FIG. 1, a substrate 10 is provided. The substrate 10 is divided into a high voltage region HV, a middle voltage region MV and a low voltage region LV. Numerous fin structures 12 are disposed within the low voltage region LV, and the fin structures 12 protrude from a surface 10a of the substrate 10. A surface 10b of the substrate 10 is within the middle region MV. A surface 10c of the substrate 10 is within the high region HV. The surface 10*a* is lower than the surface 10*b*. The surface 10*b* is lower than the surface 10*c*. A pad silicon oxide layer 14*a*, a pad silicon nitride layer 14*b* and a silicon oxide mask layer 14*c* are disposed on the surface 10*a*, the surface 10*b* and the surface 10*c* from bottom to top. An organic dielectric layer (ODL) 16*a* fills between each of the fin structures 12 and covers the high voltage region HV, the middle voltage region MV and the low voltage region LV. A patterned mask layer 16*b* covers the ODL 16*a*. A region where at least one of the fin structures 12 will be removed is defined on the patterned mask layer 16*b* within the low voltage region LV. A region within the middle voltage region MV where at least one deep trench isolation will be formed and a region within the high voltage region HV where at least one deep trench isolation will be formed are defined on the patterned mask layer 16*b*.

Figure 2:
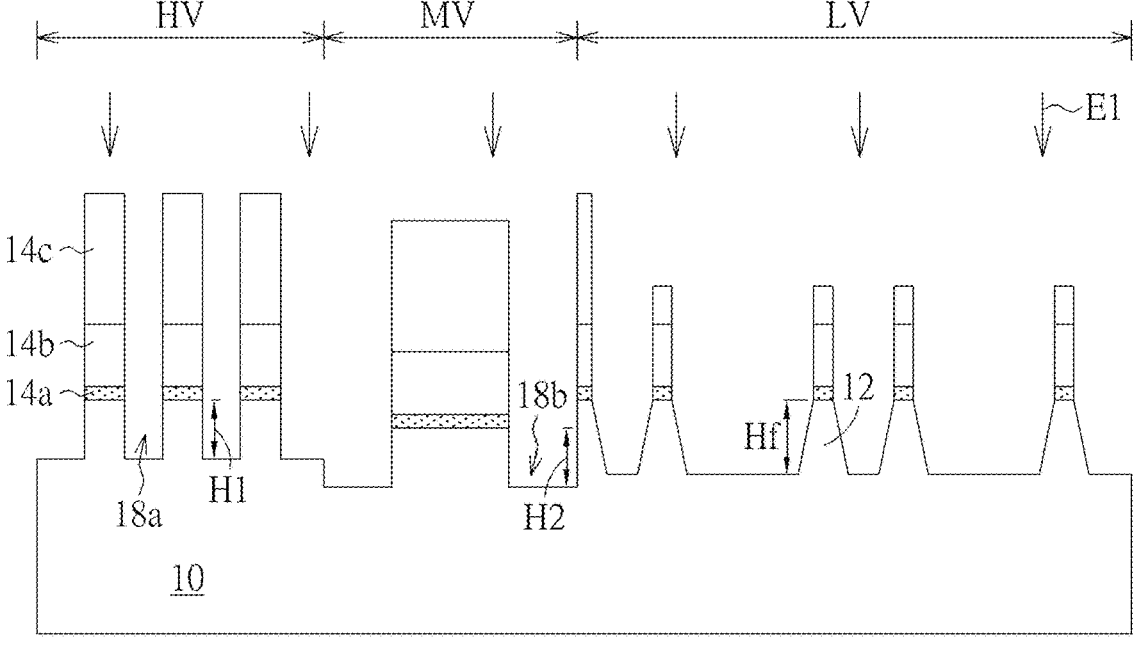

As shown in FIG. 2, a first etching process E1 is performed. The first etching process E1 includes removing entirely at least one of fin structures 12 and etching the substrate 10 within the high voltage region HV and the middle voltage region MV to form a first trench 18*a* within the high voltage region HV and a second trench 18*b* within the middle voltage region MV. In details, during the first etching process E1, the patterned mask layer 16*b* (shown in FIG. 1) serves as a mask to transfer patterns on the patterned mask layer 16*b* to the pad silicon oxide layer 14*a*, the pad silicon nitride layer 14*b* and the silicon oxide mask layer 14*c*. Thereafter, the substrate 10 is etched and the at least one fin structure 12 is removed by taking the pad silicon oxide layer 14*a*, the pad silicon nitride layer 14*b* and the silicon oxide mask layer 14*c* as a mask. Because the first trench 18*a*, the second trench 18*b* and the removal of the fin structure 12 are accomplished during the first etching process E1, the depth H1 of the first trench 18*a* and the depth H2 of the second trench 18*b* are the same as the height Hf of the fin structure 12.

Figures 3, 4:
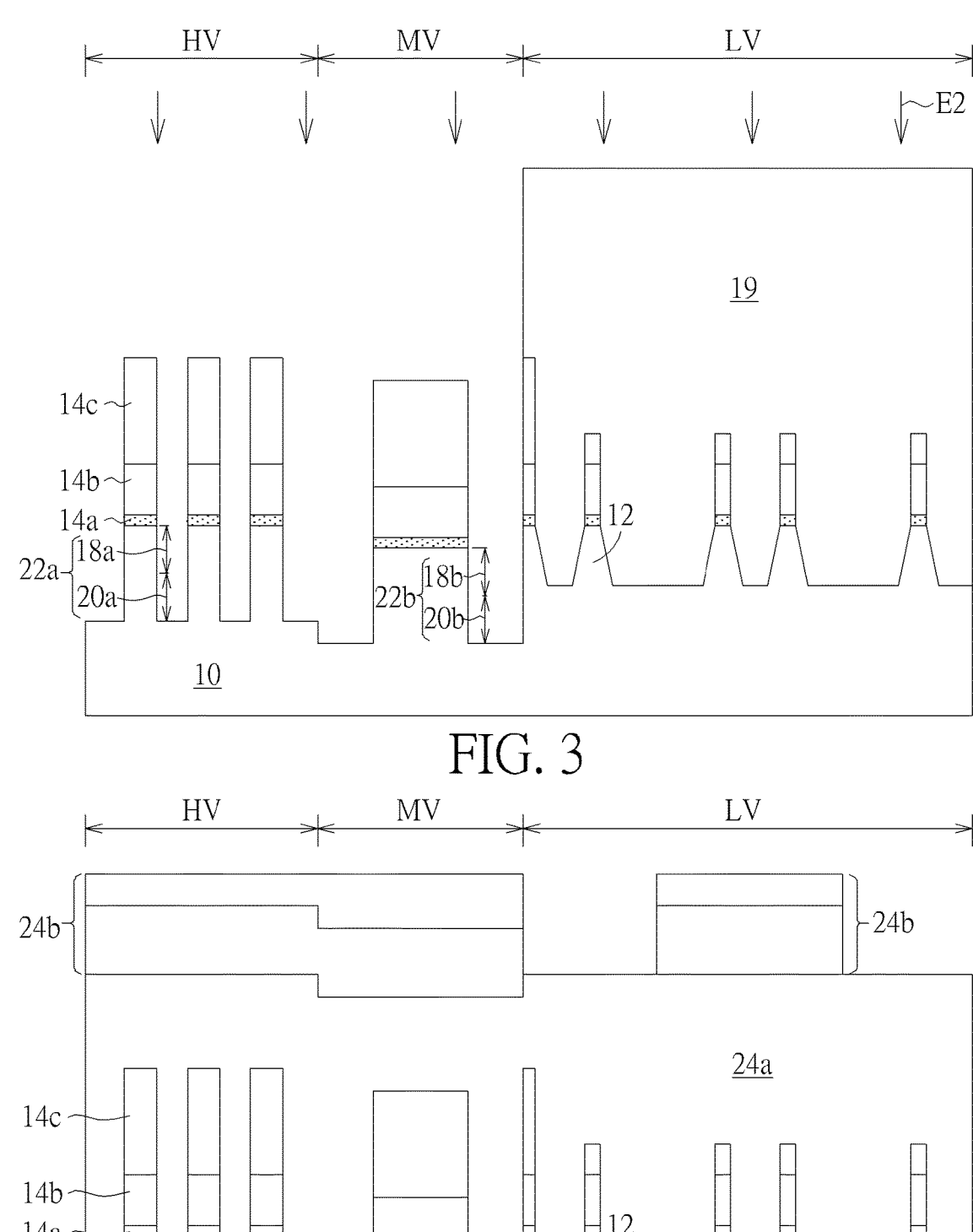

As shown in FIG. 3, a photoresist layer 19 is formed to cover the low voltage region LV, and the middle voltage region MV and the high voltage region HV are exposed through the photoresist layer 19. Next, a second etching process E2 is performed. The second etching process E2 and the first etching process E1 use the same mask. For example, the pad silicon oxide layer 14*a*, the pad silicon nitride layer 14*b* and the silicon oxide mask layer 14*c* are used as a mask during the second etching process E2. The second etching process E2 includes etching the substrate 10 at a bottom of the first trench 18*a* to extend a third trench 20*a* from the bottom of the first trench 18*a*, and etching the substrate 10 at a bottom of the second trench 18*b* to extend a fourth trench 20*b* from the bottom of the second trench 18*b*. The depth of the third trench 20*a* and the depeth of the fourth trench 20*b* are the same. The first trench 18*a* and the third trench 20*a* within the high voltage region form a first deep trench 22*a*. A depth of the first trench 18*a* is between 1000 angstroms and 1400 angstroms, and a depth of the third trench 20*a* is between 1000 angstroms and 1400 angstroms. The second trench 18*b* and the fourth trench 20*b* form a second deep trench 22*b*.

The first deep trench 22*a* and the second deep trench 22*b* are both formed by the first etching process E1 and the second etching process E2, therefore, profiles of the first deep trench 22*a* and the second deep trench 22*b* are the same. FIG. 9A depicts a magnified view of a deep trench isolation according to a preferred embodiment of the present invention. The deep trench isolation D1 is formed by filling insulating layer into the first deep trench 22*a*. The deep trench isolation D2 is formed by filling insulating layer into the second deep trench 22*b*. As shown in FIG. 9A, the first deep trench 22*a* includes a first sidewall S1 and a second sidewall S2, the first sidewall S1 faces the second sidewall S2, the first sidewall S1 is formed only by a first plane P1 and a second plane P2, an edge of the first plane P1 connects to an edge of the second plane P2. It is noteworthy that a slope of the first plane P1 is different from a slope of the second plane P2. That is, the first sidewall S1 only includes one bend B1. The second sidewall S2 is symmetrical to the first sidewall S1. Therefore, the second sidewall S2 also only includes one bend B2. Similarly, the second deep trench 22*b* also includes a first sidewall S3, a second sidewall S4, a first plane P5 and a second plane P6. A slope of the first plane P5 is different from a slope of the second plane P6. The first sidewall S3 only includes one bend B3, and the second sidewall S4 also only includes one bend B4.

Please refer to FIG. 2 and FIG. 3. During the first etching process E1, etching residues is generated on the sidewalls of the first trench 18*a* and the second trench 18*b*. The first deep trench 22*a* and the second deep trench 22*b* are formed by the first etching process E1 and the second etching process E2, and the first etching process E1 and the second etching process E2 are performed by using the same mask. However, even using the same mask during the first etching process E1 and the second etching process E2, the etching residues influence the slope of the trenches formed in the second etching process E2. Therefore, the slope of the trenches formed in the first etching process E1 become different from the slope of the trenches formed in the second etching process E2. In this way, bends B1/B2/B3/B4 (shown in FIG. 9A) are formed. Please refer to FIG. 9A again. Based on different etching parameters, the slopes of the first planes P1/P5, and the slopes of the second planes P2/P6 may be changed. For example, as shown in FIG. 9A, because the slopes are changed, an angle A between the first plane P1 and the second plane P2 is greater than 180 degrees. An angle E between the first plane P5 and the second plane P6 is greater than 180 degrees. In another embodiment, as shown in FIG. 9B, because the slopes are changed, an angle A between the first plane P1 and the second plane P2 is smaller than 180 degrees and greater than 90 degrees. An angle E between the first plane P5 and the second plane P6 is smaller than 180 degrees and greater than 90 degrees.

As shown in FIG. 4, the photoresist 19 is removed. After that, an ODL 24 is formed to fill between the fin structures adjacent to each other, fill in the first deep trench 22*a* and the second deep trench 22*b*. Furthermore the ODL 24 also covers the pad silicon oxide layer 14*a*, the pad silicon nitride layer 14*b* and the silicon oxide mask layer 14*c*. Then, a patterned mask layer 24*b* is formed to cover the ODL 24*a* and cover entirely the middle voltage region MV and the high voltage region HV. Part of the low voltage region LV is exposed through the patterned mask layer 24*b*. More specifically speaking, the patterned mask layer 24*b* defines locations on fin structures 12 which will be segmented.

Figure 5:
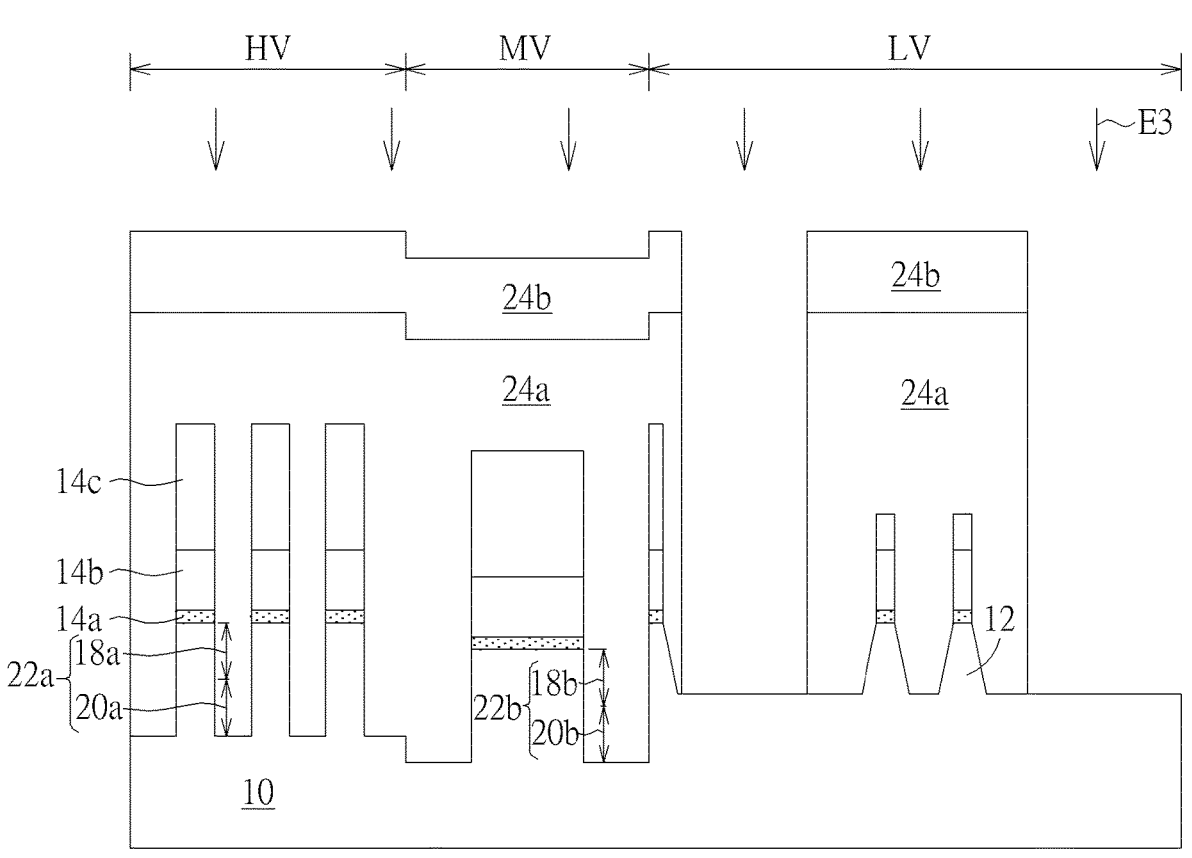
Figure 6:
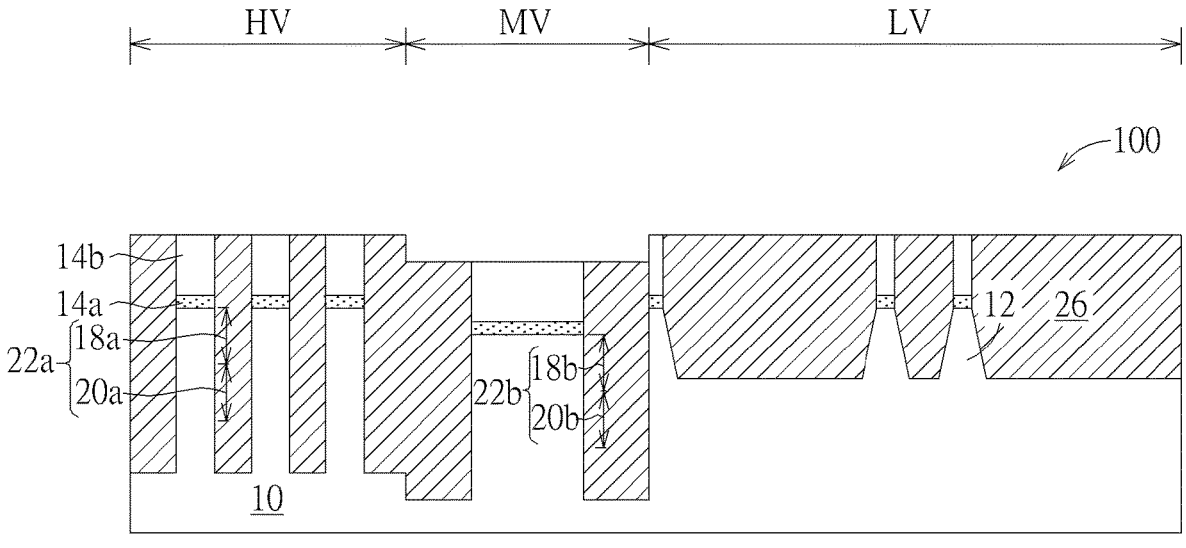

As shown in FIG. 5, a third etching process E3 is performed. The third etching process E3 includes segmenting at least one of the fin structures 12. As shown in FIG. 6, the ODL 24*a* and the patterned mask layer 24*b* are removed. Later, an insulating layer 26 is formed to cover the high voltage region HV, the middle voltage region MV and the low voltage region LV entirely. The insulating layer 26 also fills into the first deep trench 22*a* the second deep trench 22*b* and fills between the fin structures 12 adjacent to each other. Then, the top surface of the insulating layer 26 is planarized to be aligned with the top surface of the pad silicon nitride layer 14*b* by taking the pad silicon nitride layer 14*b* as an etching stop layer. Now, a semiconductor device 100 of the present invention is completed. The semiconductor device 100 can be used to form a high voltage transistor, a middle voltage transistor and a fin transistor thereon.

In continuous of FIG. 6, as shown in FIG. 7, the pad silicon nitride layer 14b and the insulating layer 26 are etched until the pad silicon nitride layer 14b is completely removed. As shown in FIG. 8, after several semicoductive processes are performed, a high voltage transistor T1, a middle voltage transistor T2 and a fin transistor T3 are respectively formed within the high voltage region HV, the middle voltage region MV and the low voltage region LV. Now, in the high voltage region HV, the first deep trench 22a and the insulating layer 26 within the first deep trench 22a together serve as a first deep trench isolation D1. In the middle voltage region MV, the second deep trench 22b and the insulating layer 26 within the second deep trench 22b together serve as a second deep trench isolation D2. The trench 28 between the fin structures 12 and the insulating layer 26 within the trench 28 together serve as a shallow trench isolation D3.

FIG. 8 depicts a semiconductor device according to a preferred embodiment of the present invention. As shown in FIG. 8, a semiconductor device 200 includes a substrate 10. The substrate 10 includes a high voltage region HV, a middle voltage region MV and a low voltage region LV. A first deep trench isolation D1 is disposed within the high voltage region HV, a second deep trench isolation D2 is disposed within the middle voltage region MV. The depth of the first deep trench isolation D1 and the depth of the second deep trench isolation D2 are the same. A shallow trench isolation D3 is disposed within the low voltage region LV. The depth of the shallow trench isolation D3 is smaller than the depth of the first deep trench isolation D1. The first deep trench isolation D1 includes a first deep trench 22a disposed within the substrate 10 and an insulating layer 26 filling in the first deep trench 22a. The second deep trench isolation D2 includes a second deep trench 22b disposed within the substrate 10 and the insulating layer 26 filling in the first deep trench 22b. The shallow trench isolation D3 includes a trench 28 disposed on the substrate 10 and the insulating layer 26 filling in the trench 28.

A high voltage transistor T1 is disposed within the high voltage region HV. The high voltage transistor T1 includes a first gate dielectric layer 30a disposed on a first surface 10d of the substrate 10 and at one side of the first deep trench isolation D1, and the first gate dielectric layer 30a contacts the first deep trench isolation D1. In this embodiment, there are two first deep trench isolations D1. The two first deep trench isolations D1 are respectively at two sides of the first gate dielectric layer 30a. That is, the first gate dielectric layer 30a is sandwiched between the two first deep trench isolations D1. A first gate electrode 32a is disposed on the first gate dielectric layer 30a. The substrate 10 at one side of the first deep trench isolation D1 which does not contact the first gate dielectric layer 30a serves as a source/drain region of the high voltage transistor T1. A middle voltage transistor T2 is disposed within the middle voltage region MV. Two second deep trench isolations D2 define an active region for the middle voltage region MV. The middle voltage region MV is on the active region within the middle voltage region MV. The middle voltage transistor MV includes a third gate dielectric layer 30b disposed on a third surface 10e of the substrate 10 and a third gate electrode 32b disposed on the third gate dielectric layer 30b. A fin transistor T3 is disposed within the low voltage region LV. The fin transistor T3 includes a fin structure 12 protruding from a second surface 10f of the substrate 10. In This embodiment, there are two fin structures 12 shown as an example. A second gate electrode 32c crosses the fin structures 12. A second gate dielectric layer 30c is disposed between the fin structures 12 and the second gate electrode 32c. The shallow trench isolation D3 is at one side of the fin structures 12 or between the adjacent fin structures 12.

Moreover, a distance between the first surface 10d and a bottom of the substrate 10 is greater than a distance between the second surface 10f and the bottom of the substrate 10. A distance between the third surface 10e and the bottom of the substrate 10 is greater than the distance between the second surface 10f and the bottom of the substrate 10.

As mentioned above, the fabricating process of the first deep trench isolation D1 and the second deep trench isolation D2 are the same. Therefore, the first deep trench isolation D1 and the second deep trench isolation D2 have the same structure. The first deep trench isolation D1 includes a first deep trench 22a disposed within the substrate 10 and an insulating layer 26 filling in the first deep trench 22a. The first deep trench 22a includes a first sidewall S1 and a second sidewall S2, the first sidewall S1 faces the second sidewall S2, the first sidewall S1 is formed only by a first plane P1 and a second plane P2, an edge of the first plane P1 connects to an edge of the second plane P2, and a slope of the first plane P1 is different from a slope of the second plane P2. The second sidewall S2 only formed by a third plane P3 and a fourth plane P4, an edge of the third plane P3 connects to an edge of the fourth plane P4, and a slope of the third plane P3 is different from a slope of the fourth plane P4. The first sidewall S1 only includes one bend B1. The second sidewall S2 also only includes one bend B2. According to a preferred embodiment of the present invention, the insulating layer 26 is preferably silicon oxide. Moreover, the first plane P1 and the second plane P2 contact the insulating layer 26. As shown in an example of FIG. 9A, an angle A between the first plane P1 and the second plane P2 is greater than 180 degrees.

The second deep trench isolation D2 also includes a first sidewall S3, a second sidewall S4, a first plane P5, a second plane P6, a third plane P7 and a fourth plane P8. A slope of the first plane P5 is different from a slope of the second plane P6. A slope of the third plane P7 is different from a slope of the fourth plane P8. The first sidewall S3 only includes one bend B3, and the second sidewall S4 also only includes one bend B4. An angle E between the first plane p5 and the second plane P6 is greater than 180 degrees.

Furthermore, according to another preferred embodiment of the present invention, as shown in FIG. 9B, if the fabricating parameters are changed, the angle A and the angle E can be smaller than 180 degree and greater than 90 degrees.

The present invention uses the first etching process to remove the fin structure and form an upper portion of the deep trench. Then, the second etching process is used to form a lower portion of the deep trench. Later, an insulating layer is formed to fill in the deep trench in the high voltage region, in the deep trench in the middle voltage region and in the shallow trench in the low voltage region. Thereafter, the insulating layer within the high voltage region, the middle voltage region and the low voltage region are planarized simultaneously. In this way, the deep trench can be assured to reach a predetermined depth, and fabricating processes of the transistors in the high voltage region, the middle voltage region and the low voltage region can be combined.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
a substrate comprising a high voltage region and a low voltage region;
a first deep trench isolation disposed within the high voltage region, wherein the first deep trench isolation comprises:
a first deep trench formed by a first trench and a second trench, wherein the first trench is below the second trench, and wherein the first deep trench comprises a first sidewall and a second sidewall, the first sidewall faces the second sidewall, the first sidewall is formed only by a first plane and a second plane, an edge of the first plane connects to an edge of the second plane, a slope of the first plane is different from a slope of the second plane, and the first plane is a sidewall of the first trench; and
a first insulating layer filling in the first deep trench;
a shallow trench isolation disposed within the low voltage region;
wherein the shallow trench isolation comprises:
a trench disposed on the substrate; and
a second insulating layer filling in the trench, wherein a depth of the shallow trench isolation is smaller than a depth of the first deep trench isolation; and
a fin structure protruding from a second surface of the substrate, wherein a depth of the first trench is the same as a height of the fin structure.

2. The semiconductor device of claim 1, wherein the second sidewall of the first deep trench is formed only by a third plane and a fourth plane, an edge of the third plane connects to an edge of the fourth plane, and a slope of the third plane is different from a slope of the fourth plane.

3. The semiconductor device of claim 1, wherein the first plane and the second plane contact the first insulating layer, and an angle between the first plane and the second plane is greater than 180 degrees.

4. The semiconductor device of claim 1, wherein the first plane and the second plane contact the first insulating layer, and an angle between the first plane and the second plane is smaller than 180 degrees and greater than 90 degrees.

5. The semiconductor device of claim 1, further comprising:
a middle voltage region disposed on the substrate;
a second deep trench isolation disposed within the middle voltage region, wherein the second deep trench isolation comprises:
a second deep trench disposed within the substrate, wherein the second deep trench comprises a third sidewall and a fourth sidewall, the third sidewall faces the fourth sidewall, the third sidewall is formed only by a fifth plane and a sixth plane, an edge of the fifth plane connects to an edge of the sixth plane, and a slope of the fifth plane is different from a slope of the sixth plane; and
a third insulating layer filling in the second deep trench, wherein a depth of the second deep trench isolation is the same as the depth of the first deep trench isolation.

6. The semiconductor device of claim 5, further comprising:
a high voltage transistor disposed within the high voltage region, wherein the high voltage transistor comprises:
a first gate dielectric layer disposed on a first surface of the substrate and at one side of the first deep trench isolation, and the first gate dielectric layer contacting the first deep trench isolation;
a first gate electrode disposed on the first gate dielectric layer;
a fin transistor disposed within the low voltage region, wherein the fin transistor comprises:
the fin;
a second gate electrode crossing the fin structure; and
a second gate dielectric layer disposed between the fin structure and the second gate electrode;
a middle voltage transistor disposed within the middle voltage region, wherein the middle voltage transistor comprises:
a third gate dielectric layer disposed on a third surface of the substrate; and
a third gate electrode disposed on the third gate dielectric layer.

7. The semiconductor device of claim 6, wherein a distance between the first surface and a bottom of the substrate is greater than a distance between the second surface and the bottom of the substrate.

8. The semiconductor device of claim 1, wherein the first sidewall only has a first bend, and the second sidewall only has a second bend.

* * * * *